United States Patent [19]
Laskoskie et al.

[11] Patent Number: 5,323,409
[45] Date of Patent: Jun. 21, 1994

[54] WAVELENGTH STABILIZATION

[75] Inventors: Clarence E. Laskoskie; Yellapu Anjan, both of Scottsdale, Ariz.

[73] Assignee: Honeywell Inc., Minneapolis, Minn.

[21] Appl. No.: 802,952

[22] Filed: Dec. 5, 1991

[51] Int. Cl.⁵ .............................................. H01S 3/13
[52] U.S. Cl. ............................ 372/32; 372/6; 372/29; 372/38; 250/227.11; 250/227.19; 385/1; 385/14
[58] Field of Search ................ 372/6, 69, 32, 29, 38; 385/1, 14; 250/227.11, 227.19

[56] References Cited

U.S. PATENT DOCUMENTS

| | | | |
|---|---|---|---|
| 3,469,922 | 9/1969 | Coccoli | 356/106 |
| 4,485,475 | 11/1984 | Large et al. | |
| 4,552,457 | 11/1985 | Giallerenzi et al. | 250/227.19 |
| 4,638,483 | 1/1987 | Bowers | 372/26 |
| 4,653,917 | 3/1987 | Moeller et al. | 356/350 |
| 4,697,876 | 10/1987 | Dyott | 350/96.29 |
| 4,734,911 | 3/1988 | Bruesselbach | 372/21 |
| 4,735,506 | 4/1988 | Pavieth | 356/350 |
| 4,759,629 | 7/1988 | Everest | 356/350 |
| 4,842,358 | 6/1989 | Hall | 350/96.15 |
| 4,881,813 | 11/1989 | Koo et al. | 250/227.19 |
| 5,138,475 | 8/1992 | Bergmann et al. | 385/14 |
| 5,173,747 | 12/1992 | Boiarski et al. | 385/12 |

FOREIGN PATENT DOCUMENTS

| | | | |
|---|---|---|---|
| 0279603A2 | 8/1988 | European Pat. Off. | |
| 0415407A3 | 3/1991 | European Pat. Off. | |
| 0435217 | 7/1991 | European Pat. Off. | 372/6 |
| 59-078587 | 5/1984 | Japan | |

*Primary Examiner*—Léon Scott, Jr.
*Attorney, Agent, or Firm*—John G. Shudy, Jr.

[57] ABSTRACT

An optical source emits a source optical signal having a source optical signal power and a wavelength. A splitter or other similar device splits the source optical signal into a first optical signal having a first optical signal power and into a second optical signal having a second optical signal power such that the source optical signal power is split between the first optical signal power and the second optical signal power. This split is dependent upon the wavelength of the source optical signal. A first detector detects the first optical signal power and a second detector detects the second optical signal power. A controller responds to the first and second detectors in order to control the wavelength of the source optical signal.

26 Claims, 2 Drawing Sheets

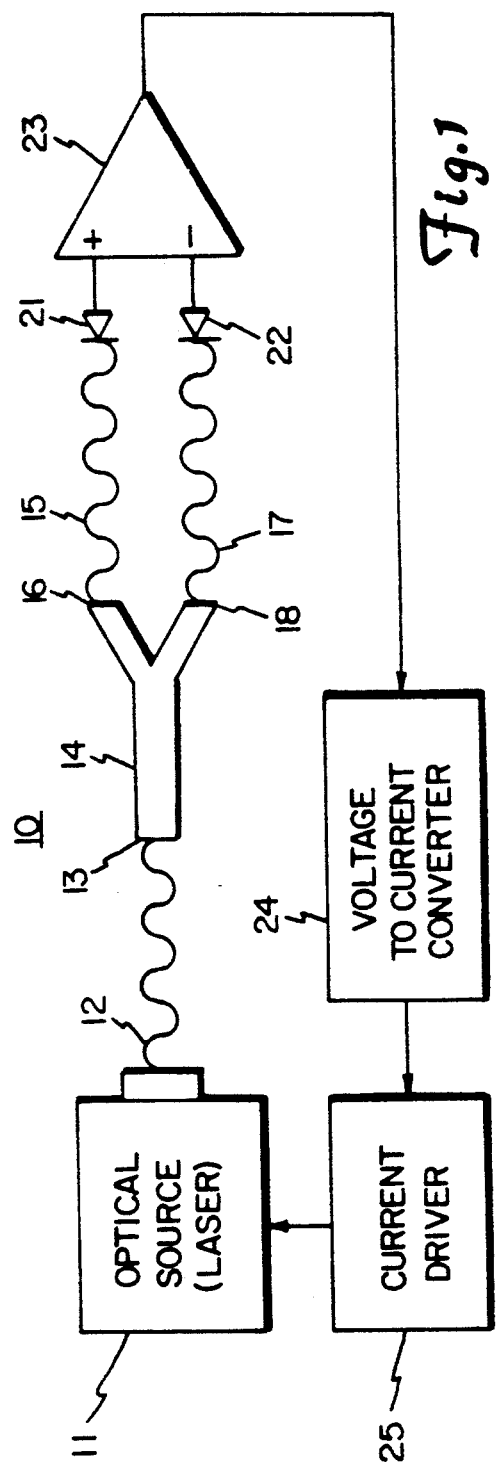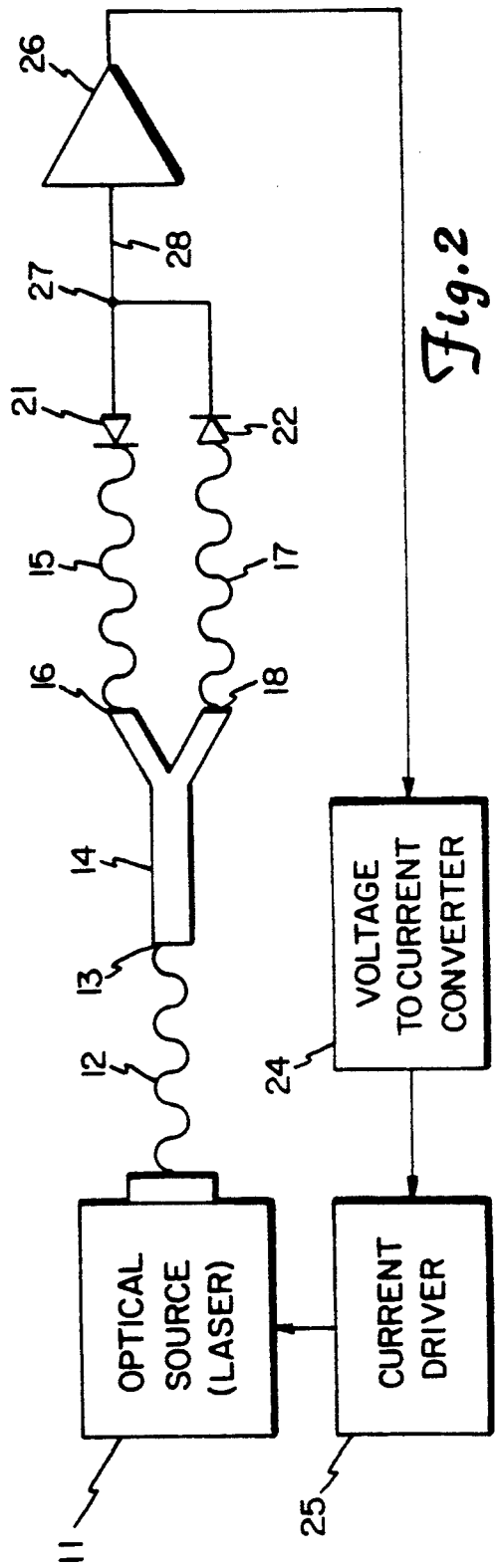

WAVELENGTH STABILIZATION

FIELD OF THE INVENTION

The present invention relates to the stabilization of the wavelength of an optical signal emitted by an optical source such as a laser.

BACKGROUND OF THE INVENTION

Optical sources, particularly broadband optical sources such as semiconductor light sources, are used in a variety of applications in which a stable wavelength of the emitted optical signal is important. For example, in ring laser and fiber optic gyroscope systems, a light source emits a light beam which is split. The resulting two light beams are then supplied to respective ends of an optical path. The two beams counterpropagate along the optical path, are recombined at the beam splitter and are received by a detection system for detecting the phase difference between the two counterpropagating light beams. If the gyroscope is at rest, the path length around the optical path is ideally the same for both light beams so that no phase difference between the two light beams will be detected. However, as the gyroscope rotates, the time that is required for one beam to travel the path is different than the time that is required for the other beam to traverse the path. In effect, one of the beams will travel a longer path than the other beam. Since the phases of the two beams are a function of the time required to travel their respective paths, any difference in that time between the two light beams will result in a phase difference.

Rotation of the gyroscope does not affect the frequency (i.e. wavelength) of the optical signal. However, environmental changes, such as temperature changes, can influence the wavelength of the signal supplied to the gyroscope by the optical source. Since the phase difference (i.e. phase shift) between the counterpropagating light beams is dependent upon wavelength as well as rotation, a constant wavelength is necessary so that the relationship between rotation and phase difference is repeatable from measurement to measurement. Therefore, it is important to minimize the effects of these environmental changes on the wavelength of the source optical signal so that any changes in phase of the output optical signals is due to rotation and not to changes in environmental conditions.

SUMMARY OF THE INVENTION

The present invention stabilizes the wavelength of an optical signal emitted by an optical source. In one aspect of the invention, a beam splitter or other similar device splits the source optical signal into first and second optical signal powers. The split between the first and second optical signal powers is dependent upon the wavelength of the source optical signal. A controller responds to the first and second optical signal powers in order to control the wavelength of the source optical signal.

In one aspect of the invention, the controller includes a first optical signal detector for detecting the first optical signal power, a second optical signal detector for detecting the second optical signal power, and a wavelength controller responsive to the first and second detectors for controlling the wavelength of the source optical signal.

In another aspect of the invention, the first detector may be a first light detecting diode for detecting the first optical signal power and the second detector may be a second light detecting diode for detecting the second optical signal power. The anode of the first light detecting diode is connected to the positive input of a differential amplifier and the anode of the second light detecting diode may be connected to the negative input of the differential amplifier. (Alternatively, the cathodes of the first and second light emitting diodes may be connected to the respective positive and negative inputs of a differential amplifier.) The differential amplifier provides an output representative of the difference between the first optical signal power and the second optical signal power and is used for controlling the current supplied to the optical source to in turn control the wavelength of the source optical signal.

In still a further aspect of the invention, the anode of one light detecting diode and the cathode of the other light detecting diode may be connected to a common node. Since the currents flowing between the node and the diodes will have opposite polarities, the output current from the node represents the difference of the currents of the two light detecting diodes and thus represents the difference between the first optical signal power and the second optical signal power. The output current from the node is amplified if desired and used to control the current supplied to the optical source in order to control the wavelength of the source optical signal.

In yet another aspect of the invention, the first and second detectors may be used to control a temperature controller which in turn controls the temperature of the optical source. Since the wavelength of the optical source is temperature dependent, the control of the temperature of the optical source will control the wavelength of the source optical signal.

BRIEF DESCRIPTION OF THE DRAWINGS

These and other features and advantages will become more apparent from a detailed consideration of the invention when taken in conjunction with the drawings in which:

FIG. 1 shows a first embodiment of the wavelength stabilizing control system according to the present invention;

FIG. 2 shows a second embodiment of a wavelength stabilization control system according to the present invention;

DETAILED DESCRIPTION

Figure 3:
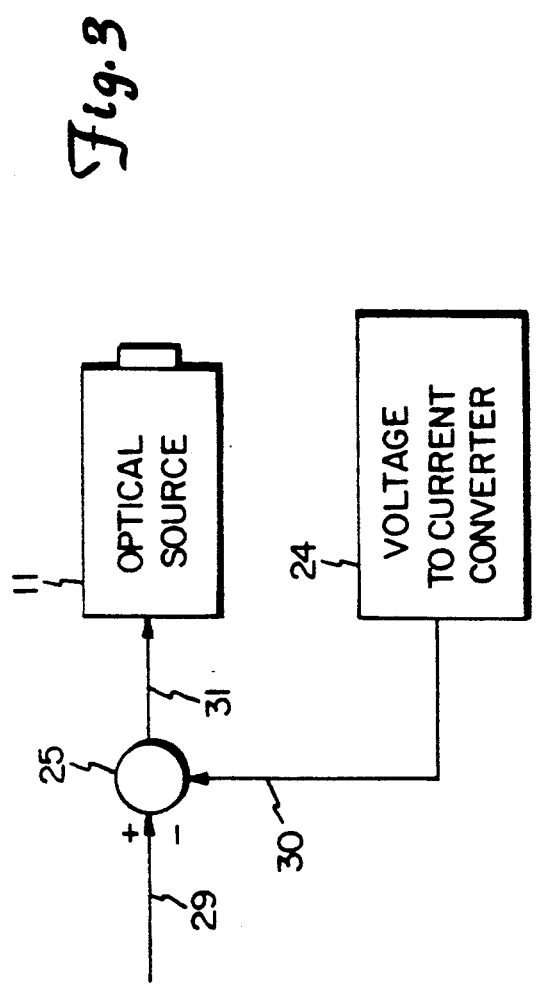
FIG. 3 shows the current driver of FIGS. 1 and 2 in more detail.

Stabilization system 10, as shown in FIG. 1, comprises an optical source, such as laser 11, for emitting an optical signal 12, such as a light beam, having power $P(\lambda)$. Optical signal 12 enters port 13 of an optical component 14. Optical component 14 may be a WDM (wavelength division multiplexer), a beam splitter, an etalon, a grating, or the like. Optical component 14 splits the source optical signal 12 entering port 13 into a first optical signal (or light beam) 15 exiting port 16 and a second optical signal (or light beam) 17 exiting port 18. The power contained in each of the optical signals 15 and 17 will be determined by the transmittance $T_1(\lambda)$ between port 13 and port 16 and the transmittance $T_2(\lambda)$ between port 13 and port is respectively. In the ideal case, $T_1(\lambda)$ and $T_2(\lambda)$ are complementary and no transmission loss occurs. Thus, $T_1(\lambda) + T_2(\lambda)$ is equal to 1. The transmittances $T_1(\lambda)$ and $T_2(\lambda)$ of these devices are, as indicated, dependent upon the wavelength $\lambda$. Accordingly, the wavelength dependent output powers of optical signals 15 and 17 are given by the following equations:

$$P_1(\lambda) = P_s(\lambda) * T_1(\lambda) \quad (1)$$

and $$P_2(\lambda) = P_s(\lambda) * T_2(\lambda) \quad (2)$$

where $P_1(\lambda)$ represents the power of the source optical signal 12 emitted from optical source 11, $P_1(\lambda)$ represents the power of the first optical signal 15 exiting port 16 of optical component 14, $P_2(\lambda)$ represents the power of the second optical signal 17 exiting port 18 of optical component 14, $T_1(\lambda)$ represents the transmittance of optical component 14 between ports 13 and 16, $T_2(\lambda)$ represents the transmittance of optical component 14 between ports 13 and 18, and the * symbol represents multiplication.

The total power of the first optical signal 15 which exits port 16 is given by the following equation:

$$P_1 = \int_\lambda P_1(\lambda) d\lambda \quad (3)$$

The total power of the second optical signal 17 which exits port 18 is given by the following equation:

$$P_2 = \int_\lambda P_2(\lambda) d\lambda \quad (4)$$

Ideally all light which enters the component 14 exits ports 16 and 18. Since the transmittance of the exit ports is a function of wavelength of the source optical signal 12, a greater or lesser portion of the source optical signal 12 will transmit through exit port 16 rather than exit port 18 dependent upon the wavelength of the source optical signal. Thus, as the wavelength of the source optical signal 12 changes, the split between $P_1$ and $P_2$ will change.

The power in the first optical signal 15 is sensed by detector 21 which may be a light detecting diode. Similarly, the power in the second optical signal 17 is sensed by detector 22 which also may be a light detecting diode. The anode of light detecting diode 21 is connected to the positive input of differential amplifier 23 and the anode of light detecting diode of 22 is connected to the negative input of differential amplifier 23. Light detecting diode 21 produces an output current which is converted to a voltage by the differential amplifier 23 according to the following equation:

$$V_1 = K_1 * P_1 \quad (5)$$

where $V_1$ is the voltage produced by light detecting diode 21 and $K_1$ is a constant which incorporates light detector efficiencies and electrical gains. Similarly, light detecting diode 22 produces an output current which is converted to a voltage by the differential amplifier 23 according to the following equation:

$$V_2 = K_2 * P_2 \quad (6)$$

where $V_2$ is the voltage produced by light detecting diode 22 and $K_2$ is a constant which incorporates light detector efficiencies and electrical gains. Differential amplifier 23 will provide an output signal representing the difference between $V_1$ and $V_2$. This output signal is connected to voltage to current converter 24 which converts the output voltage from differential amplifier 23 to a current signal. This current signal is supplied to current driver 25. Current driver 25 responds to the current from voltage to current converter 24 so as to control the current supplied to optical source 11 to in turn control the wavelength of the source optical signal 12.

Light detecting diodes 21 and 22 may be selected so that constants $K_1$ and $K_2$ are equal. If so, current driver 25 is initially arranged to provide a current to optical source 11 such that the power of source optical signal 12 is evenly divided by optical component 14 between the power of first optical signal 15 and the power of second optical signal 17. When the power of the source optical signal 12 is evenly divided between the powers of first and second optical signals 15 and 16, light detecting diodes 21 and 22 will supply equal voltages to the respective positive and negative inputs of differential amplifier 23. Thus, the output of differential amplifier 23 is 0 and no adjustment will be made to current driver 25. On the other hand, if optical source 11 experiences fluctuations of either the injection current or the environmental temperature, the wavelength of source optical signal 12 will change. This change in wavelength of source optical signal 12 will result in an unequal division of power between first optical signal 15 and second optical signal 17 which will result in unequal currents being supplied by light detecting diodes 21 and 22 to the inputs of differential amplifier 23. Accordingly, differential amplifier 23 will supply a non-zero output to voltage to current converter 24 which will convert that non-zero voltage to a current output. Current driver 25 will respond to this current from voltage to current converter 24 to adjust the injection current supplied to optical source 11 to bring the wavelength of source optical signal 12 back to a value which produces a zero output from differential amplifier 23.

Alternatively, if light detecting diodes 21 and 22 are not matched (i.e. constants $K_1$ and $K_2$ are not equal), an injection current may be initially supplied to optical source 11 so that, although the power of source optical signal 12 is unevenly split between first optical signal 15 and second optical signal 17, the light detecting diodes 21 and 22 will supply equal voltages to differential amplifier 23. In this case, as long as the wavelength of the initial source optical signal 12 does not change, no adjustment to the injection current of optical source 11 will be made. However, if the wavelength of the source optical signal 12 changes for any reason, the output of differential amplifier 23 will become non-zero which will result in a current output from voltage to current converter 24. This current output will be used by current driver 25 to alter the injection current supplied to optical source 11 to bring the wavelength back to its initial value.

Instead of selecting an initial injection current (and, therefore, an initial source optical signal wavelength) to produce a zero voltage output from differential amplifier 23, voltage to current converter 24 can be initially arranged so that it supplies a zero output current to current driver 25 at the desired wavelength of optical signal 12 even though differential amplifier 23 supplies a non-zero voltage output. If the wavelength of the source optical signal 12 changes for any reason, the output of voltage to current converter 24 will become non-zero which will result in connection of the wavelength of source optical signal 12 until that wavelength is again at the desired value.

FIG. 2 shows an alternative which eliminates the need for a differential amplifier. In this case, the anode of light detecting diode 21 and the cathode of light detecting diode 22 are connected to node 27. With this arrangement, the current flowing between light detecting diode 21 and node 27 will be of one polarity while the current flowing through light detecting diode 22 and node 27 will be of an opposite polarity. Thus, the current in line 28 represents the difference between these currents and, therefore, the difference in power between optical signals 15 and 17. This difference current may be amplified by an amplifier 26, if desired, and the resulting voltage supplied to voltage to current converter 24.

As shown in FIG. 3, current driver 25 may include a summing junction 25' which will receive a current on input 29 equal to an initial injection current selected to provide the desired wavelength for optical signal 12. The output from voltage to current converter 24 is connected to input 30 of summing junction 25'. Thus, any signal on input 30 acts as an error signal indicating that the wavelength of source optical signal 12 has drifted from its desired value. In this case, the error on input 30 will adjust the injection current in line 31 being supplied to optical source 11 to bring the wavelength of source optical signal 12 back to its desired value. Alternatively, a desired wavelength may be selected which will produce an error signal at input 30 having a predetermined non-zero value. Thus, when this predetermined non-zero value is combined with the current at input 29, optical signal 12 will have the desired wavelength. However, any variation in wavelength of optical signal 12 will change the error signal away from its predetermined non-zero value, and thus change the current at output 31, until optical signal 12 regains its desired wavelength.

Figure 4:
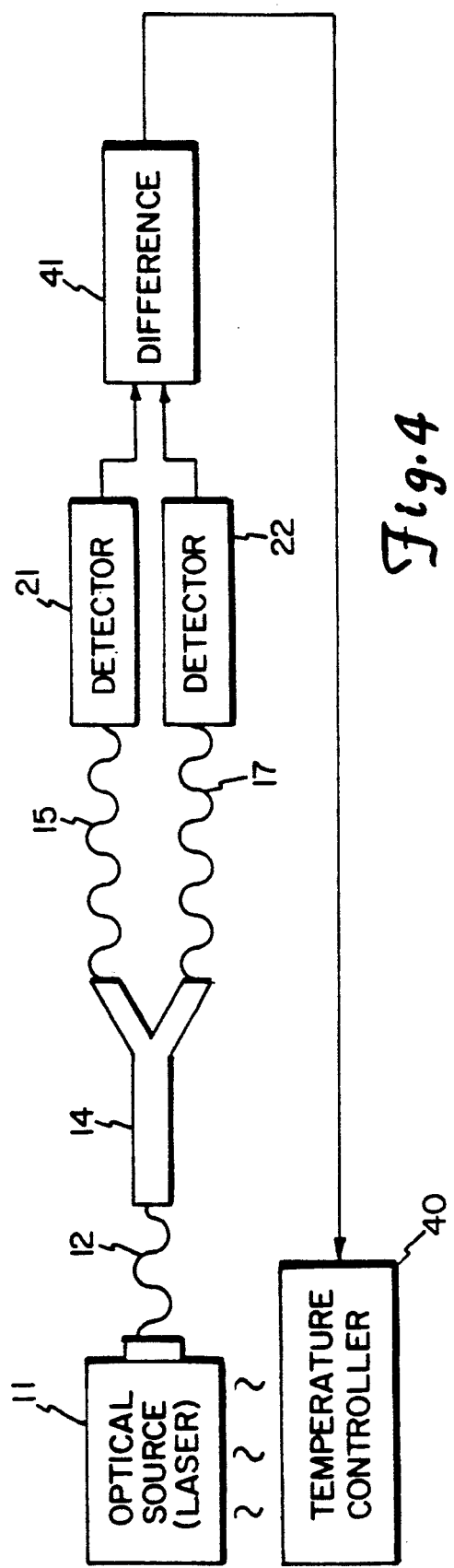
FIG. 4 shows a wavelength stabilization control system utilizing a temperature controller for controlling the wavelength of the source optical signal.

As shown in FIG. 4, instead of controlling the injection current supplied to optical source 11, the temperature of optical source 11 may be controlled in order to in turn control the wavelength of source optical signal 12. In this case, voltage to current converter 24 and current driver 25 shown in FIGS. 1 and 2 are replaced by temperature controller 40. Temperature controller 40 receives the output from difference circuit 41 in order to adjust the temperature of optical source 11 to control the wavelength of source optical signal 12. Difference circuit 41 may represent either differential amplifier 23 of FIG. 1, node 27 of FIG. 2, or any other arrangement for providing an output to temperature controller 40 based upon the difference in power between first and second optical signals 15 and 17.

We claim:

1. An apparatus for providing a wavelength stabilized optical signal comprising:
   source means for providing a source optical signal, said source optical signal having a source optical signal power and a wavelength;
   splitting means, having a first port connected to said source means, and having second and third ports, for receiving said source optical signal and for splitting said source optical signal into a first optical signal having a first optical signal power and a second optical signal having a second optical signal power so that said source optical signal power is split by said splitting means between said first optical signal power and said second optical signal power, said split of said source optical signal power between said first optical signal power and said second optical signal power being dependent upon a first optical signal transmittance between the first port and the second port and a second optical signal transmittance between the first port and the third port respectively, and the first and second optical signal transmittances being dependent upon said wavelength of said source optical signal;
   first detector means, connected to the second port of said splitting means, for receiving said first optical signal and for providing a first detector signal indicative of said first optical signal power;
   second detector means, connected to the third port of said splitting means, for receiving said second optical signal and for providing a second detector signal indicative of said second optical signal power; and
   control means coupled to said first and second detector means and to said source means for controlling said wavelength of said source optical signal in response to said first and second detector signals.

2. The apparatus of claim 1 wherein said control means comprises differential amplifier means connected to said first and second detector means for providing an output signal representing the difference between said first detector signal and said second detector signal, said differential amplifier means having a positive input connected to said first detector means and a negative input connected to said second detector means.

3. The apparatus of claim 2 wherein said control means further comprises current control means connected to said differential amplifier means and to said source means, said current control means being responsive to said output signal representing said difference between said first detector signal and said second detector signal for controlling current supplied to said source means in order to control said wavelength of said source optical signal.

4. The apparatus of claim 3 wherein said output signal is a voltage signal and wherein said current control means comprises a voltage to current converter means for converting said voltage signal to a current signal, said control means being responsive to said current signal for controlling said current supplied to said source means in order to control said wavelength of said source optical signal.

5. The apparatus of claim 3 wherein said current control means comprises a first input for receiving a current input, a second input for receiving an error input dependent upon said output signal, and an output for providing a source control signal dependent upon said current input and said error input, said output of said current control means being connected to said source means for controlling said wavelength of said source optical signal as a function of said source control signal.

6. The apparatus of claim 5 wherein said output signal is a voltage signal and wherein said current control means further comprises a voltage to current converter connected to said differential amplifier means and to said second input of said current control means for converting said voltage signal to a current which is connected to said current control means as said error input.

7. The apparatus of claim 1 wherein said first detector means comprises a first light detecting diode having an anode and a cathode, wherein said second detector means comprises a second light detecting diode having an anode and a cathode, and wherein said control means comprises connecting means for connecting the anode of said first light detecting diode to said cathode of said second light detecting diode so that said first and second detector signals are subtracted from one another, said control means providing an output signal representing the difference between said first detector signal and said second detector signal.

8. The apparatus of claim 7 wherein said control means further comprises current control means connected to said connecting means and to said source means, said current control means being responsive to said output signal representing said difference between said first detector signal and said second detector signal for controlling current supplied to said source means in order to control said wavelength of said source optical signal.

9. The apparatus of claim 8 wherein said output signal is a voltage signal and wherein said current control means comprises a voltage to current converter means for converting said voltage signal to a current signal, said control means being responsive to said current signal for controlling said current supplied to said source means in order to control said wavelength of said source optical signal.

10. The apparatus of claim 8 wherein said current control means comprises a first input for receiving a current input, a second input for receiving an error input dependent upon said output signal, and an output for providing a source control signal dependent upon said current input and said error input, said output of said current control means being connected to said source means for controlling said wavelength of said source optical signal as a function of said source control signal.

11. The apparatus of claim 10 wherein said output signal is a voltage signal and wherein said current control means further comprises a voltage to current converter connected to said connecting means and to said second input of said current control means for converting said voltage signal to a current which is connected to said current control means as said error input.

12. The apparatus of claim 1 wherein said control means comprises temperature control means for controlling the temperature of said source means in response to the difference between said first detector signal and said second detector signal to in turn control said wavelength of said source optical signal.

13. A method of stabilizing the wavelength of a source optical signal, said source optical signal having a source optical signal power, said method comprising the following steps:
  splitting said source optical signal power between a first optical signal power and a second optical signal power according to the wavelength of said source optical signal, wherein magnitudes of the first optical signal power and of the second optical signal power are dependent upon the wavelength of said source optical signal;
  detecting the magnitude of said first optical signal power;
  detecting the magnitude of said second optical signal power;
  detecting a difference between the magnitudes of said first and second optical signal powers; and
  controlling said wavelength of said source optical signal according to the difference between the magnitudes of said first and second optical signal powers.

14. An apparatus for providing a wavelength stabilized optical signal comprising:
  source means for providing a source optical signal, said source optical signal having a source optical signal power and a wavelength;
  splitting means for receiving said source optical signal and for splitting said source optical signal into a first optical signal having a first optical signal power and a second optical signal having a second optical signal power so that said source optical signal power is split by said splitting means between said first optical signal power and said second optical signal power, said split between said first optical signal power and said second optical signal power being dependent upon said wavelength of said source optical signal;
  first detector means for receiving said first optical signal and for providing a first detector signal indicative of said first optical signal power;
  second detector means for receiving said second optical signal and for providing a second detector signal indicative of said second optical signal power; and
  control means coupled to said first and second detector means and to said source means for controlling said wavelength of said source optical signal in response to said first and second detector signals; and
  wherein:
  said control means comprises differential amplifier means connected to said first and second detector means for providing an output signal representing the difference between said first detector signal and said second detector signal, said differential amplifier means having a positive input connected to said first detector means and a negative input connected to said second detector means;
  said control means further comprises current control means connected to said differential amplifier means and to said source means, said current control means being responsive to said output signal representing said difference between said first detector signal and said second detector signal for controlling current supplied to said source means in order to control said wavelength of said source optical signal; and
  said output signal is a voltage signal and wherein said current control means comprises a voltage to current converter means for converting said voltage signal to a current signal, said control means being responsive to said current signal for controlling said current supplied to said source means in order to control said wavelength of said source optical signal.

15. An apparatus for providing a wavelength stabilized optical signal comprising:
  source means for providing a source optical signal, said source optical signal having a source optical signal power and a wavelength;
  splitting means for receiving said source optical signal and for splitting said source optical signal into a first optical signal having a first optical signal power and a second optical signal having a second optical signal power so that said source optical signal power is split by said splitting means between said first optical signal power and said second optical signal power, said split between said first optical signal power and said second optical signal power being dependent upon said wavelength of said source optical signal;

first detector means for receiving said first optical signal and for providing a first detector signal indicative of said first optical signal power;

second detector means for receiving said second optical signal and for providing a second detector signal indicative of said second optical signal power; and control means coupled to said first and second detector means and to said source means for controlling said wavelength of said source optical signal in response to said first and second detector signals; and wherein:

said control means comprises differential amplifier means connected to said first and second detector means for providing an output signal representing the difference between said first detector signal and said second detector signal, said differential amplifier means having a positive input connected to said first detector means and a negative input connected to said second detector means;

said control means further comprises current control means connected to said differential amplifier means and to said source means, said current control means being responsive to said output signal representing said difference between said first detector signal and said second detector signal for controlling current supplied to said source means in order to control said wavelength of said source optical signal;

said current control means comprises a first input for receiving a current input, a second input for receiving an error input dependent upon said output signal, and an output for providing a source control signal dependent upon said current input and said error input, said output of said current control means being connected to said source means for controlling said wavelength of said source optical signal as a function of said source control signal; and said output signal is a voltage signal and said current control means further comprises a voltage to current converter connected to said differential amplifier means and to said second input of said current control means for converting said voltage signal to a current which is connected to said current control means as said error input.

16. An apparatus for providing a wavelength stabilized optical signal comprising:

source means for providing a source optical signal, said source optical signal having a source optical signal power and a wavelength;

splitting means for receiving said source optical signal and for splitting said source optical signal into a first optical signal having a first optical signal power and a second optical signal having a second optical signal power so that said source optical signal power is split by said splitting means between said first optical signal power and said second optical signal power, said split between said first optical signal power and said second optical signal power being dependent upon said wavelength of said source optical signal;

first detector means for receiving said first optical signal and for providing a first detector signal indicative of said first optical signal power;

second detector means for receiving said second optical signal and for providing a second detector signal indicative of said second optical signal power; and, control means coupled to said first and second detector means and to said source means for controlling said wavelength of said source optical signal in response to said first and second detector signals; and wherein:

said first detector means comprises a first light detecting diode having an anode and a cathode, wherein said second detector means comprises a second light detecting diode having an anode and a cathode, and wherein said control means comprises connecting means for connecting the anode of said first light detecting diode to said cathode of said second light detecting diode so that said first and second detector signals are subtracted from one another, said control means providing an output signal representing the difference between said first detector signal and said second detector signal; and said control means further comprises current control means connected to said connecting means and to said source means, said current control means being responsive to said output signal representing said difference between said first detector signal and said second detector signal for controlling current supplied to said source means in order to control said wavelength of said source optical signal.

17. The apparatus of claim 16 wherein said output signal is a voltage signal and wherein said current control means comprises a voltage to current converter means for converting said voltage signal to a current signal, said control means being responsive to said current signal for controlling said current supplied to said source means in order to control said wavelength of said source optical signal.

18. The apparatus of claim 16 wherein said current control means comprises a first input for receiving a current input, a second input for receiving an error input dependent upon said output signal, and an output for providing a source control signal dependent upon said current input and said error input, said output of said current control means being connected to said source means for controlling said wavelength of said source optical signal as a function of said source control signal.

19. The apparatus of claim 18 wherein said output signal is a voltage signal and wherein said current control means further comprises a voltage to current converter connected to said connecting means and to said second input of said current control means for converting said voltage signal to a current which is connected to said current control means as said error input.

20. An apparatus for providing a wavelength stabilized optical signal comprising:

source means for providing a source optical signal, said source optical signal having a source optical signal power and a wavelength;

splitting means for receiving said source optical signal and for splitting said source optical signal into a first optical signal having a first optical signal power and a second optical signal having a second optical signal power so that said source optical signal power is split by said splitting means between said first optical signal power and said second optical signal power, said split between said first optical signal power and said second optical signal power being dependent upon said wavelength of said source optical signal;

first detector means for receiving said first optical signal and for providing a first detector signal indicative of said first optical signal power;

second detector means for receiving said second optical signal and for providing a second detector signal indicative of said second optical signal power; and control means coupled to said first and second detector means and to said source means for controlling said wavelength of said source optical signal in response to said first and second detector signals; and wherein said control means comprises temperature control means for controlling the temperature of said source means in response to the difference between said first detector signal and said second detector signal to in turn control said wavelength of said source optical signal.

21. An apparatus for providing a wavelength stabilized signal comprising:

source means for emitting a source signal having a source signal power and a wavelength;

splitting means for receiving said source signal and for splitting said source signal power between a first signal power and a second signal power dependent upon said wavelength of said source signal;

control means responsive to said first and second signal powers for controlling said wavelength of said source signal in response to said first and second signal powers; and wherein said control means further comprises current control means responsive to said first and second signal powers for controlling current supplied to said source means in order to control said wavelength of said source signal.

22. The apparatus of claim 21 wherein said current control means comprises a voltage to current converter means for converting a voltage dependent upon said first and second signal powers to a current signal, said current control means being responsive to said current signal for controlling said current supplied to said source means in order to control said wavelength of said source signal.

23. The apparatus of claim 21 wherein said current control means comprises a first input for receiving a current input, a second input for receiving an error input dependent upon said first and second signal powers, and an output for providing a source control signal dependent upon said current input and said error input, said output of said current control means being connected to said source means for controlling said wavelength of said source signal as a function of said source control signal.

24. The apparatus of claim 23 wherein said current control means further comprises a voltage to current converter for converting a voltage signal dependent upon said first and second signal powers to a current which is connected to said source control means as said error input.

25. An apparatus for providing a wavelength stabilized signal comprising:

source means for emitting a source signal having a source signal power and a wavelength;

splitting means for receiving said source signal and for splitting said source signal power between a first signal power and a second signal power dependent upon said wavelength of said source signal;

control means responsive to said first and second signal powers for controlling said wavelength of said source signal in response to said first and second signal powers; and wherein said control means comprises temperature control means for controlling the temperature of said source means in response to said first and said second signal powers to in turn control said wavelength of said source signal.

26. A wavelength stabilization apparatus comprising:

a light source for emitting a first light signal having a wavelength and a first magnitude of power;

a coupler having an input port connected to said light source, having first and second output ports, having a first light transmittance that varies according to light wavelength between the input port and the first output port and a second light transmittance that varies according to light wavelength between the input port and the second output port, wherein said coupler splits the first magnitude of power of the first light signal into a second light signal having a second magnitude of power and into a third light signal having a third magnitude of power, the first and second magnitudes are proportional to the first and second light transmittances, respectively, the second light signal exits the first output port and the third light signal exits the second output port; and a wavelength controller, connected to the first and second output ports, and to said light source, wherein the wavelength of said light source is controlled in response to the second and third magnitudes of power of the second and third light signals, respectively.

* * * * *